(12) United States Patent
Zhu

(10) Patent No.: US 12,255,085 B2
(45) Date of Patent: Mar. 18, 2025

(54) WAFER HOLDER AND OPERATING METHOD OF THE SAME

(71) Applicant: INNOSCIENCE (SUZHOU) SEMICONDUCTOR CO., LTD., Suzhou (CN)

(72) Inventor: Xudong Zhu, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/788,734

(22) PCT Filed: Mar. 10, 2022

(86) PCT No.: PCT/CN2022/080207
§ 371 (c)(1),
(2) Date: Jun. 23, 2022

(87) PCT Pub. No.: WO2023/168663
PCT Pub. Date: Sep. 14, 2023

(65) Prior Publication Data
US 2024/0170316 A1    May 23, 2024

(51) Int. Cl.
*H01L 21/68* (2006.01)
*H01L 21/673* (2006.01)

(52) U.S. Cl.
CPC ........ *H01L 21/68* (2013.01); *H01L 21/67346* (2013.01)

(58) Field of Classification Search
CPC ............... H01L 21/68; H01L 21/67346; H01L 21/68714; H01L 21/683
See application file for complete search history.

(56) References Cited

U.S. PATENT DOCUMENTS

| | | | |
|---|---|---|---|
| 6,550,619 | B2 | 4/2003 | Bores et al. |
| 8,813,964 | B2 | 8/2014 | Pylant et al. |
| 10,535,542 | B2 | 1/2020 | Niederhofer et al. |
| 10,546,767 | B2 | 1/2020 | Wenger et al. |

(Continued)

FOREIGN PATENT DOCUMENTS

| | | |
|---|---|---|
| CN | 202977389 U | 6/2013 |
| CN | 105810626 A | 7/2016 |
| CN | 111211084 A | 5/2020 |

(Continued)

OTHER PUBLICATIONS

International Search Report and Written Opinion of the corresponding PCT application No. PCT/CN2022/080207 mailed on Nov. 28, 2022.

*Primary Examiner* — Jason L Vaughan
*Assistant Examiner* — Amanda Kreiling
(74) *Attorney, Agent, or Firm* — Li & Cai Intellectual Property (USA) Office

(57) ABSTRACT

A wafer holder includes a carrier plate, and blocking devices. The carrier plate includes a base and a guiding structure. The base has a carrier surface. The guiding structure surrounds the base. The blocking devices are coupled to the carrier plate through the guiding structure, and the blocking devices are configured to move along the guiding structure. Each of the blocking devices has a curved wall, and the curved walls at least partially surrounds an area above the carrier surface.

20 Claims, 7 Drawing Sheets

(56) References Cited

U.S. PATENT DOCUMENTS

2020/0219743 A1    7/2020   Zhen et al.

FOREIGN PATENT DOCUMENTS

| CN | 214542148 U | * | 10/2021 |
| EP | 1405333 B1 | | 11/2010 |
| JP | H0982792 A | | 3/1997 |
| KR | 20010001893 U | | 1/2001 |
| KR | 20080092525 A | | 10/2008 |
| KR | 20110075095 A | | 7/2011 |
| TW | I684239 B | | 2/2020 |

* cited by examiner

WAFER HOLDER AND OPERATING METHOD OF THE SAME

FIELD OF THE DISCLOSURE

The present disclosure generally relates to a holder. More specifically, the present disclosure relates to a wafer holder having movable blocking devices and guiding structure.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistors (HFET), and modulation-doped FETs (MODFET).

In the process of manufacturing semiconductor wafers having HEMTs, the wafers must be transported between processes. The wafers are fragile and damage to the surface of the wafers may cause serious issue. To prevent from damaging the wafers, the wafers must be packaged and transported to minimize harm. During transportation, multiple semiconductor wafers are stacked into a container. However, while inserting the wafers, the wafers may still be damaged by collision between the wafers and the container. Also, during transportation, scratching between the wafers may damage the surfaces of the wafers. Therefore, protective and accessible wafer holders (container) are needed.

SUMMARY OF THE DISCLOSURE

In accordance with one aspect of the present disclosure, a wafer holder is provided. The wafer holder includes a carrier plate, and blocking devices. The carrier plate includes a base and a guiding structure. The base has a carrier surface. The guiding structure surrounds the base. The blocking devices are coupled to the carrier plate through the guiding structure, and the blocking devices are configured to move along the guiding structure. Each of the blocking devices has a curved wall, and the curved walls at least partially surrounds an area above the carrier surface.

In accordance with another aspect of the present disclosure, a wafer holder is provided. The wafer holder includes a carrier plate and side elastic layers. The carrier plate includes a bottom elastic layer and a guiding structure. The guiding structure surrounds the bottom elastic layer. The side elastic layers are coupled to the carrier plate through the guiding structure. The side elastic layers occupy an area above the bottom elastic layer, and the side elastic layers are configured to move along the guiding structure.

In accordance with another aspect of the present disclosure, an operating method of a wafer holder is provided. The operating method includes moving blocking devices to first positions; disposing at least one wafer on a carrier surface of a base; and moving the blocking devices to second positions. The wafer holder includes a carrier plate and the blocking devices. The carrier plate includes the base and a guiding structure. The guiding structure surrounds the carrier surface. The blocking devices are coupled to the carrier plate through the guiding structure, and the blocking devices are configured to move along the guiding structure. Each of the blocking devices has a curved wall at least partially surrounding the carrier surface. The blocking devices are brought together while being on the first positions, and the blocking devices are separate from each other's while being on the second positions.

By the above configuration, wafers can be easily insert on the carrier plate of the wafer holder, and the wafer holder can protect the wafers on the carrier plate.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
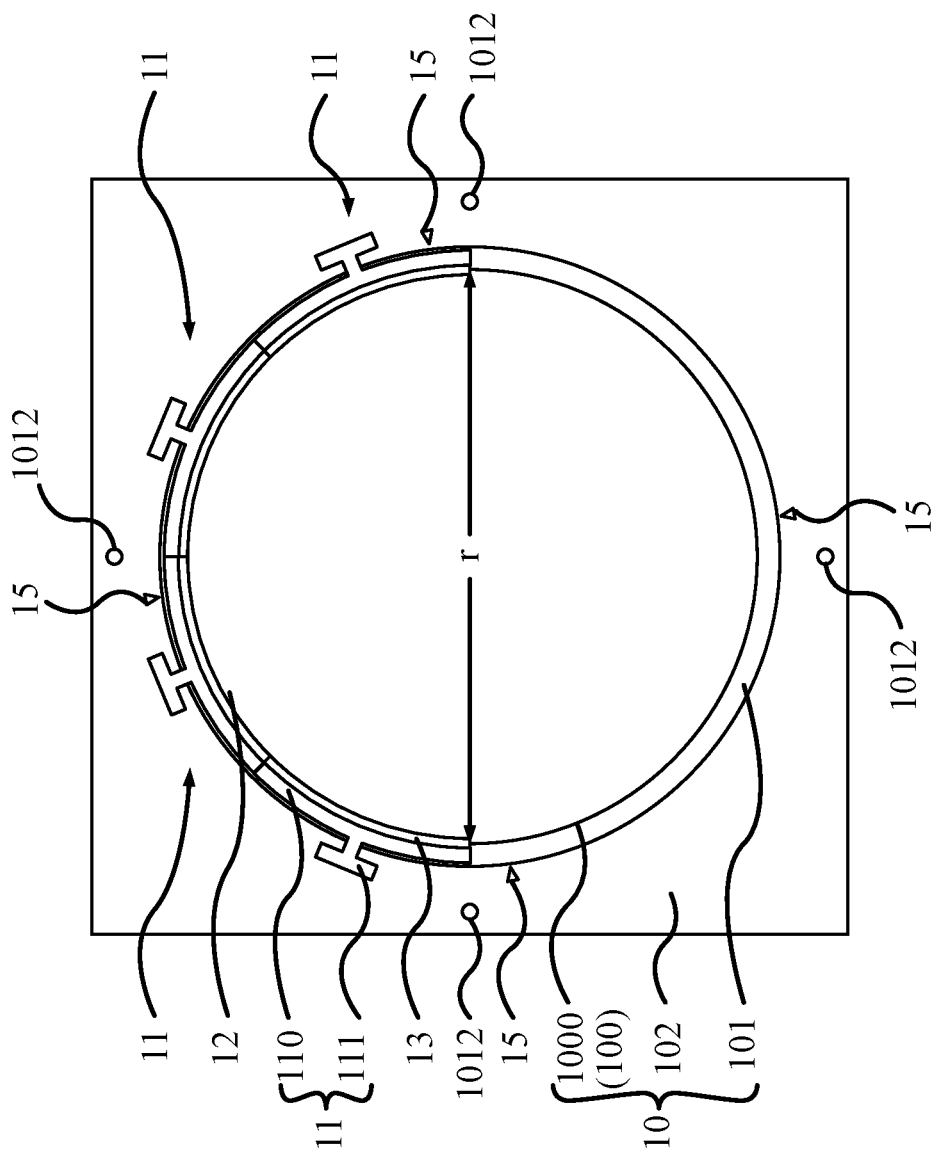
FIG. 1 and FIG. 2 are top views of a wafer holder according to some embodiment of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor circuits/devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 2:
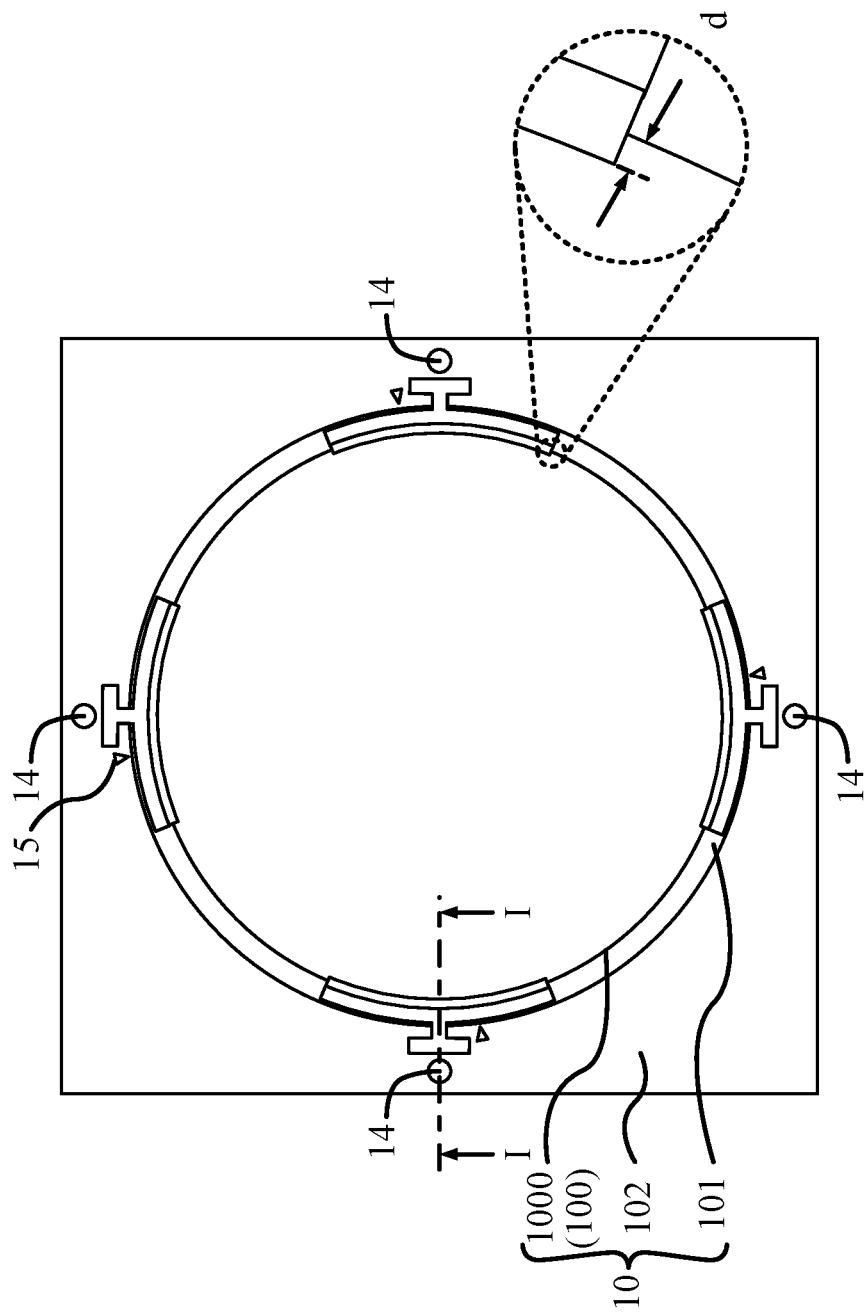

FIG. 1 and FIG. 2 are top views of a wafer holder according to some embodiment of the present disclosure. The wafer holder 1 has a carrier plate 10 and a plurality of blocking devices 11.

The blocking devices 11 and the carrier plate 10 are combined, and the blocking devices 11 are able to move on the carrier plate 10. To be specific, the carrier plate 10 has a base 100 and a guiding structure 101, and the guiding structure 101 surrounds the base 100. In this embodiment, the base 100 has a carrier surface 1000. The blocking devices 11 are coupled to the carrier plate 10 through the guiding structure 101, and the blocking devices 11 are able to move along the border or edge of the base 100. In other words, the guiding structure 101 form a track surrounding the carrier surface 1000 of the base 100, and the blocking devices 11 are able to move along the track.

For example, the carrier surface 1000 of this embodiment is circular, and the guiding structure 101 is circular as well and formed a ring-like structure that surrounds the base 100. In other words, the carrier surface 1000 is rounded, and the guiding structure 101 encircles the carrier surface 1000.

The blocking devices 11 are configured to move along the guiding structure 101, and each of the blocking devices 11 has a curved wall 110. The curved walls 110 at least partially surround an area above the carrier surface 1000. To be specific, the curved walls 110 at least partially surround a right circular cylinder area above the carrier surface 1000, and the blocking devices 11 does not intersect or overlap the right circular cylinder area. Therefore, the area above the carrier surface 1000 is adapted to load and unload one or more wafer.

Moreover, FIG. 1 is the top view while the blocking devices 11 are located at the first position, and FIG. 2 is the top view while the blocking devices 11 are located at the second position. In this embodiment, the operating method of the wafer holder 1 includes: moving the blocking devices 11 to the first position (FIG. 1); disposing at least one wafer on the carrier surface 1000 of the base 100; and moving the blocking devices 11 to the second position (FIG. 2).

While the blocking devices 11 are located at the first location, the curved walls 110 of the blocking devices 11 cover half of the periphery of the carrier surface 1000, and the wafer holder 1 provide a large opening to load or unload one or more wafers from the carrier surface 1000. In some embodiment of the present disclosure, the curved walls 110 of the blocking devices 11 may cover one third or a quarter of the periphery of the carrier surface 1000 while the blocking devices 11 are located at the first location.

Referring to FIG. 2, while the blocking devices 11 are located at the second location, the blocking devices 11 surround the wafers and hold the wafer in the wafer holder 1. While facing the carrier surface 1000, the blocking devices 11 are located at the 12, 3, 6, and 9 o'clock positions respectively, and the wafers will be hold by the blocking devices 11. In other words, the curved walls 110 of the blocking devices 11 cover top, bottom, right, and left sides of the carrier surface 1000 while locating at the second positions, and the wafer on the carrier surface 1000 may be protected by the blocking devices 11 at these sides.

Therefore, the wafer holder 1 can provide an install mode (FIG. 1) and a holding mode (FIG. 2), and the install mode can provide an easy way to input or remove the wafer from the carrier surface 1000 without scratching or impacting any part of the wafer holder 1, and the holding mode can hold the wafers in the wafer holder 1 firmly, and the sideways movement of the wafer is limited in the holding mode.

For example, while in the install mode, the blocking devices 11 are located at the first position, and the curved walls 110 are configured to cover half of the periphery of the carrier surface 1000. While in the holding mode, the blocking device 11 are located at the second position, and the curved walls are configured to maintain a wafer on the carrier surface 1000. Therefore, the wafer holder 1 can provide a safe and easy wafer loading process and unloading process, and the wafer holder 1 can provide a safe packaging during shipping.

In this embodiment, the carrier plate 10 of the wafer holder 1 has a base 102. The base 102 surrounds the guiding structure 101 and the base 100. The shape of the base 102 of this embodiment is a square, and the blocking devices 11 are adjacent to the sides of the square while the blocking devices 11 are located at the second position. Therefore, the base 102 provide large areas near the corners, and a plurality of connecting structures can be formed thereon, and the connecting structures are configured to connect a cover.

Figure 3:
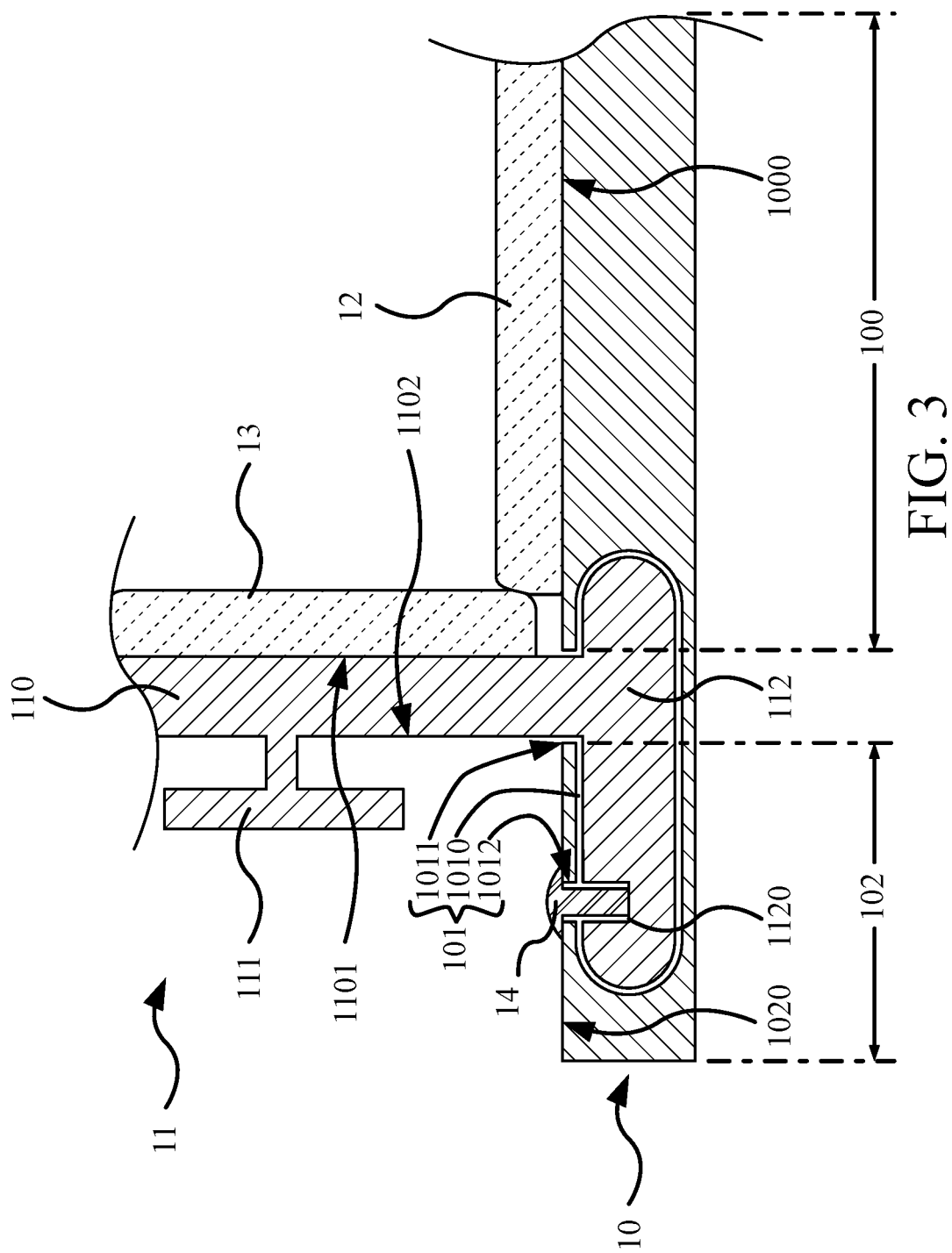
FIG. 3 is a sectional view according to a cutting plane line I in FIG. 2.

FIG. 3 is a sectional view according to the cutting plane line I in FIG. 2. In this embodiment, the wafer holder 1 includes a bottom elastic layer 12, and the bottom elastic layer 12 is disposed on the carrier surface 1000. The bottom elastic layer 12 on the carrier surface 1000 can carry the wafers and provide proper support to the wafers, and the wafers couldn't be scratched by the carrier surface 1000 of the base 100. For example, the bottom elastic layer 12 may include sponge, which is elastic and compressible and being able to protect the wafers.

The wafer holder 1 also includes side elastic layers 13. Each of the side elastic layers 13 is disposed on a surface 1101 of one of the curved walls 110, and the surface 1101 is facing towards the carrier surface 1000.

To be specific, the surface 1101 of every curved wall 110 and the carrier surface 1000 are perpendicular, and the surfaces 1101 surround the area above the carrier surface 1000. While one of more wafers are disposed on the carrier surface 1000, the side elastic layers 13 on the surfaces 1101 may surround the wafers and provide protection.

In the operating method of this embodiment, the step of disposing the wafer on the carrier surface 1000 of the base 100 includes: disposing the wafer on the bottom elastic layer 12; and moving the wafer until the wafer touches side elastic layers 13 on the curved walls 110. While the blocking devices 11 are located at the first location, the side elastic layers 13 can touch and protect the edges of the wafers.

While the blocking devices 11 are located at the second location, the blocking devices 11 can maintain the wafer on the carrier surface 1000. Moreover, the side elastic layers 13 on the curved walls 110 of the blocking device 11 can touch and hold the wafer without scratching.

In one aspect, the wafer holder 1 of this embodiment includes the carrier plate 10 and the side elastic layers 13, and the carrier plate 10 includes the bottom elastic layer 12 and the guiding structure 101 surrounded the bottom elastic layer 12.

The side elastic layers 13 are coupled to the carrier plate 10 through the guiding structure 101, and the side elastic layers 13 occupy an area above the bottom elastic layer 12, and the side elastic layers 13 are configured to move along the guiding structure 101.

The bottom elastic layer 12 can carry one or more wafers, and the side elastic layers 13 can protect the wafers sideways. To be specific, the bottom elastic layer 12 and the side elastic layers 13 are adapted to touch and hold the wafers, and therefore the wafers on the bottom elastic layer 12 cannot move sideways.

For example, the bottom elastic layer 12 and the side elastic layer 13 may serve as a cushion layer, a buffer layer, or a shock reducing layer, and the bottom elastic layer 12 and the side elastic layers 13 may both include sponge, and the bottom elastic layer 12 and the side elastic layers 13 are compressible. The side elastic layers 13 are configured to touch and affix the wafers on the bottom elastic layer 12. In some embodiments of the present invention, the bottom elastic layer 12 and the side elastic layer 13 may also include sponge, polyurethane (PU), expanded polyethylene (EPE), Tyvek paper, the combination thereof, or other resilient materials. Also, the bottom elastic layer 12 and the side elastic layers 13 are replaceable, and new elastic layers 12, 13 can be install before any wafer storage and shipment.

In one aspect, the carrier surface 1000 of the base 100 is rounded, and the wafers may be disposed on the carrier surface 1000. For example, the diameter of the carrier surface 1000 falls within a range from 204 mm to 205 mm, and the carrier surface 1000 is adapted to carry one or multiple 8 inches nitride-based semiconductor wafers. The guiding structure 101 encircles the carrier surface 1000, and the blocking devices 11 and the side elastic layers 13 may move along the border of the area above the carrier surface 1000, where the wafers are disposed.

Moreover, the cylinder area over the carrier surface 1000 is adapted to accommodate wafers, and the blocking devices 11 are located outside and around the cylinder area, and at least part of every side elastic layer 13 is inside the cylinder area while no wafer is loaded. Therefore, the side elastic layers 13 and the wafers can be interference fit or friction fit after the wafers are loaded.

For example, the thickness d of the part of the side elastic layer 13 overlapping the bottom elastic layer 12 is in the range from 3 mm to 5 mm, and, therefore, the side elastic layer 13 can hold the wafer properly.

In some embodiment, the blocking devices 11 are located outside the cylinder area above the carrier surface 1000, and the edges or the surface 1101 of the blocking devices 11 coincide with the edge of the carrier surface 1000, and the side elastic layers 13 are located in the cylinder area above the carrier surface 1000. Therefore, the blocking devices 11 can adjust the position of the side elastic layers 13 in the cylinder area, so the side elastic layers 13 and the wafers can be interference fit.

In one aspect, each of the blocking device 11 has a knob 111, and the knob 111 and the side elastic layer 13 are disposed on the opposite sides of every curved wall 110. Each of the knobs 111 is disposed on back of one of the side elastic layers 13. Every side elastic layer 13 is disposed on the surface 1101 of the curved wall 110 that is facing towards the area above the carrier surface 1000 of the base 100, and every knob 111 is disposed on the other surface 1102 of the curved wall 110 that is facing backward towards the area above the carrier surface 1000 of the base 100.

In this embodiment, the side elastic layers 13 can touch, press and hold the wafers, and the knobs 111 are adapted to adjust the positions of the side elastic layers 13 on the blocking devices 11. In other words, users can move the blocking devices 11 through the knobs 111, and the positions of the blocking devices 11 can be adjusted easily.

In one aspect, the bottom elastic layer 12 touches the side elastic layers 13, and the elastic layers 12, 13 can provide more protection while carrying the wafers. To be specific, the bottom part of every side elastic layer 13 touches the periphery of the bottom elastic layer 12, and the side elastic layers 13 and the bottom elastic layer 12 provide elastic surfaces that is connected continuously, which provide a proper protection to the loaded wafers.

Moreover, the curved walls 110 of this embodiment is completely covered by the side elastic layers 13 respectively. Therefore, the side elastic layers 13 can fully protect and hold the wafers on the bottom elastic layer 12.

In this embodiment, the guiding structure 101 has an accommodation space 1010. The accommodation space 1010 is located in the carrier plate 10, and the accommodation space 1010 is located below the carrier surface 1000 and a top surface 1020 at the periphery of the carrier plate 10.

Each of the blocking devices 11 has a guiding base 112. The curved wall 110 is connected to the guiding base 112, and the guiding base 112 is installed in the accommodation space 1010. The shape of the sectional view of the accommodation space 1010 is similar to the shape of the sectional view of the guiding base 112, while the sectional view of the guiding base 112 is smaller than the sectional view of the accommodation space 1010. Therefore, the guiding base 112 can move along the accommodation space 1010.

Figure 4:
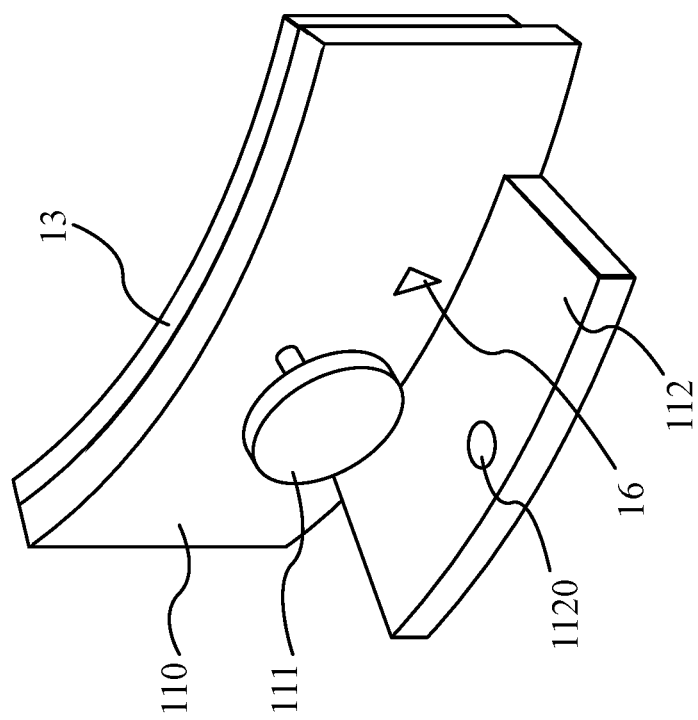
FIG. 4 is a perspective view of a blocking device according to some embodiment of the present disclosure.

FIG. 4 is a perspective view of a blocking device 11 according to some embodiment of the present disclosure. The guiding base 112 is fan-shaped, and the accommodation space 1010 also form a ring in the carrier plate 10. The guiding base 112 are accommodated in the accommodation space 1010, and the accommodation space 1010 form a circular track in the carrier plate 10.

The curved wall 110 is disposed on the guiding base 112 perpendicularly. The guiding structure 101 has an opening 1011, and the opening 1011 is formed between the top surface 1020 and the carrier surface 1000. The opening 1011 is formed on the top of the accommodation space 1010, and the curved wall 110 can pass through the opening 1011. The curved wall 110 is located above the carrier plate 10, and the guiding base 112 is located in the carrier plate 10, and the curved wall 110 and the guiding base 112 are connected, and the connected part pass through the opening 1011 of the guiding structure 101.

In one aspect, the guiding structure 101 has a plurality of fastening structures 1012. The fastening structures 1012 are located on the top of the accommodation space 1010, and the fastening structure 1012 and the opening 1011 are adjacent. In other words, the fastening structures 1012 are formed on the top surface 1020 of the base 102.

Each of the guiding bases 112 has a fastening structure 1120, and each of the fastening structures 1012 is configured to fasten one of the fastening structures 1120, and the position of the blocking devices 11 can be fixed through the fastening structures 1012, 1120. In this embodiment, the fastening structures 1012, 1120 are openings that can be overlapped by moving the blocking devices 11, and the fastening structures 1012, 1120 can be fastened through a fastener 14. In some embodiment of the present disclosure, the fastening structures 1012, 1120 can include magnet or snap fasteners, the present disclosure is not limited thereto.

In this embodiment, the wafer holder 1 includes the fasteners 14. The fastening structures 1012 are openings, and the fastening structures 1120 are openings, and the fasteners 14 are configured to insert into the fastening structures 1012, 1120. While the blocking devices 11 are at the second position, the fasteners 14 are able to hold the position between the blocking devices 11 and the carrier plate 10, and the wafer holder 1 can provide a safe package for wafers.

The wafer holder 1 of this embodiment further includes indicators 16 and indicators 15. The indicators 16 are disposed on the blocking devices 11, and the indicators 15 are disposed on the carrier plate 10. The indicators 16 are configured to align with the indicators 15.

In this embodiment, the indicators 15 are arrows pointing a plurality of positions on the guiding structure 101, and the indicators 16 are arrows being disposed on the back of the curved walls 110 of the blocking devices 11. By aligning the indicators 15, 16, users can move the blocking devices 11 to the second position, so that the fasteners 14 can fasten the fastening structures 1012, 1120.

Figure 5:
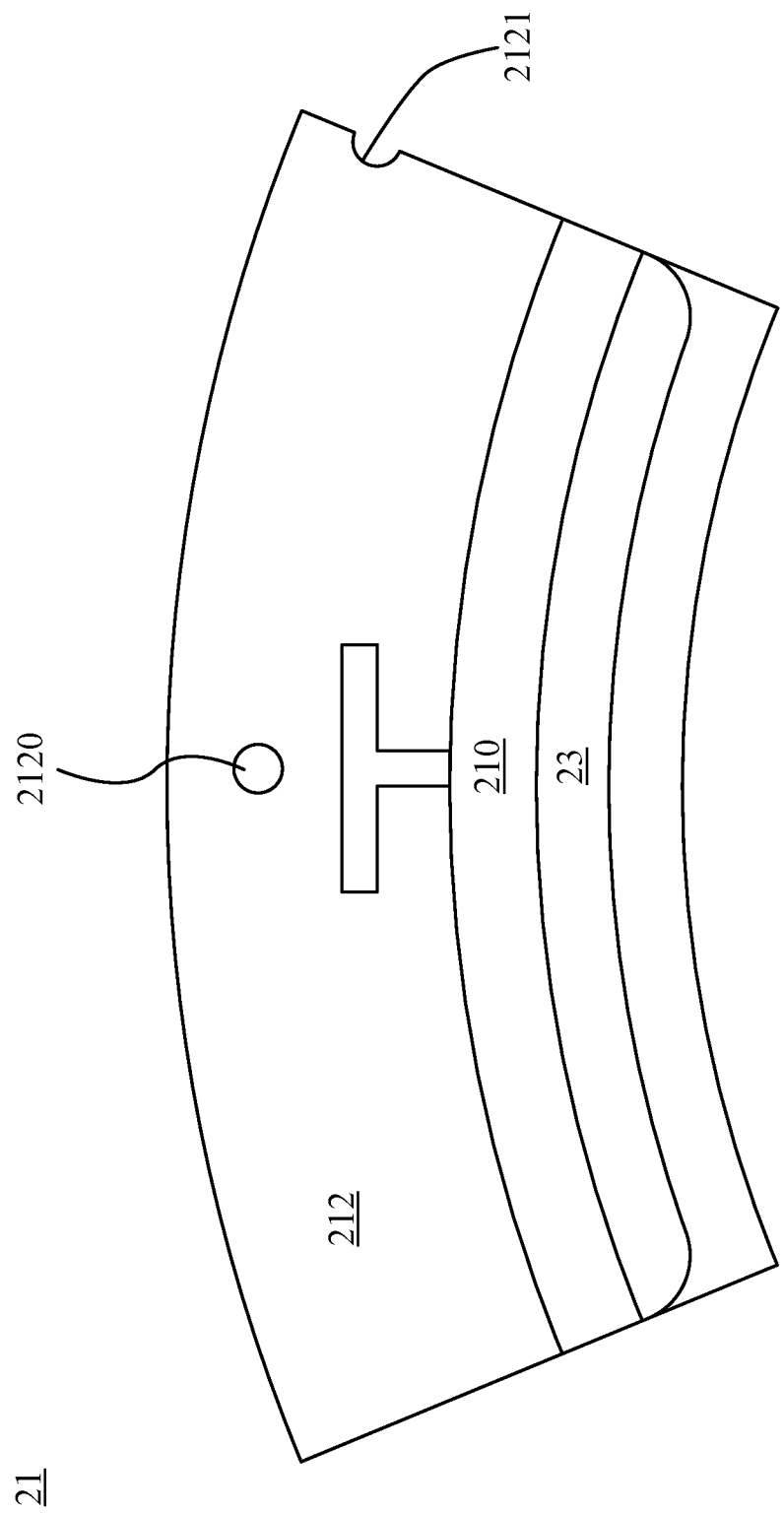
FIG. 5 is a top view of a blocking device according to some embodiments of the present disclosure.

FIG. 5 is a top view of a blocking device 21 according to some embodiments of the present disclosure. The wafer holder of this embodiment has four blocking devices 21, and two of the blocking devices 21 have semicircle openings 2121. Each of the semicircle openings 2121 is located on an edge of the guiding base 212.

To be specific, a side elastic layer 23 is disposed on the curved wall 210, and the curved wall 210 is disposed on the guiding base 212, and the guiding base 212 and the curved wall 210 occupy the same circular angle. The straight edges of the curved wall 210 coincide with the straight edges of the guiding base 212.

The semicircle opening 2121 can be aligned with part of the fastening structure of the guiding structure as shown in FIG. 1, and the blocking devices 21 can be fix at the first position through fasteners 14 (as shown in FIG. 3). In other words, the fastener 14 can pass through the fastening structure 2120 or the semicircle opening 2121, and the fastening structure 2120 can be fastened while the blocking device is at the second location, and the semicircle opening 2121 can be fastened while the blocking device is at the first location.

Figure 6:
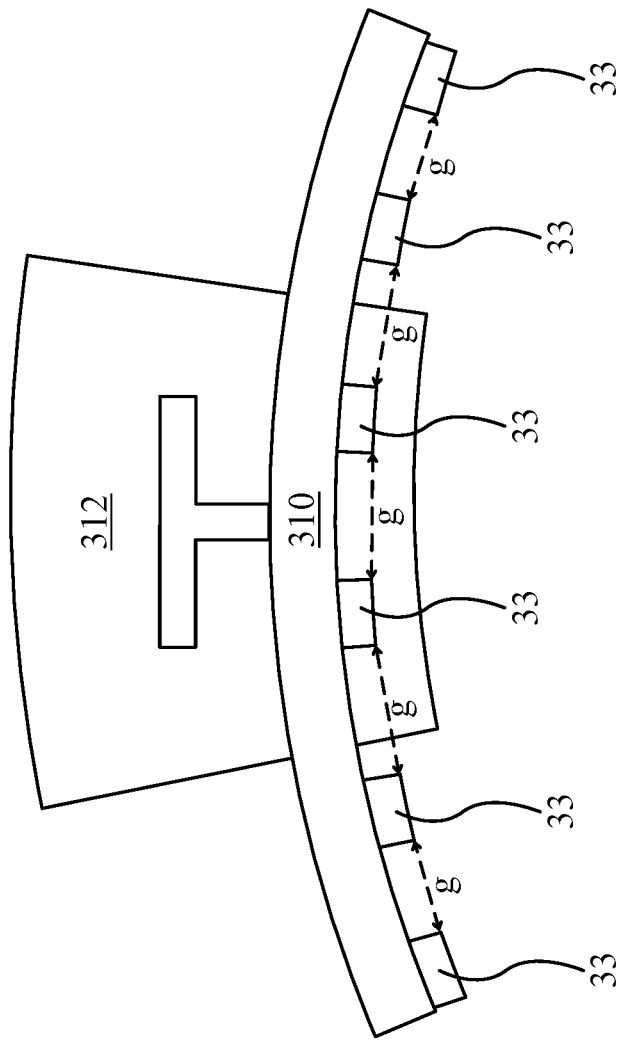
FIG. 6 is a top view of a blocking device according to some embodiments of the present disclosure.

FIG. 6 is a top view of a blocking device 31 according to some embodiments of the present disclosure. In this embodiment, a plurality of side elastic layers 33 are disposed on a curved wall 310, and the curved wall 310 is disposed on the guiding base 312. In this embodiment, the side elastic layers 33 are separated, and gaps g are form among the side elastic layers 33.

In this embodiment, the touch area between the wafers and the side elastic layers 33 is reduced, and scratching can be further prevented. Also, in this embodiment, the side elastic layers 33 form into elastic strips. In some embodiment of the present disclosure, the side elastic layers 33 may form into small bumps.

Figure 7:
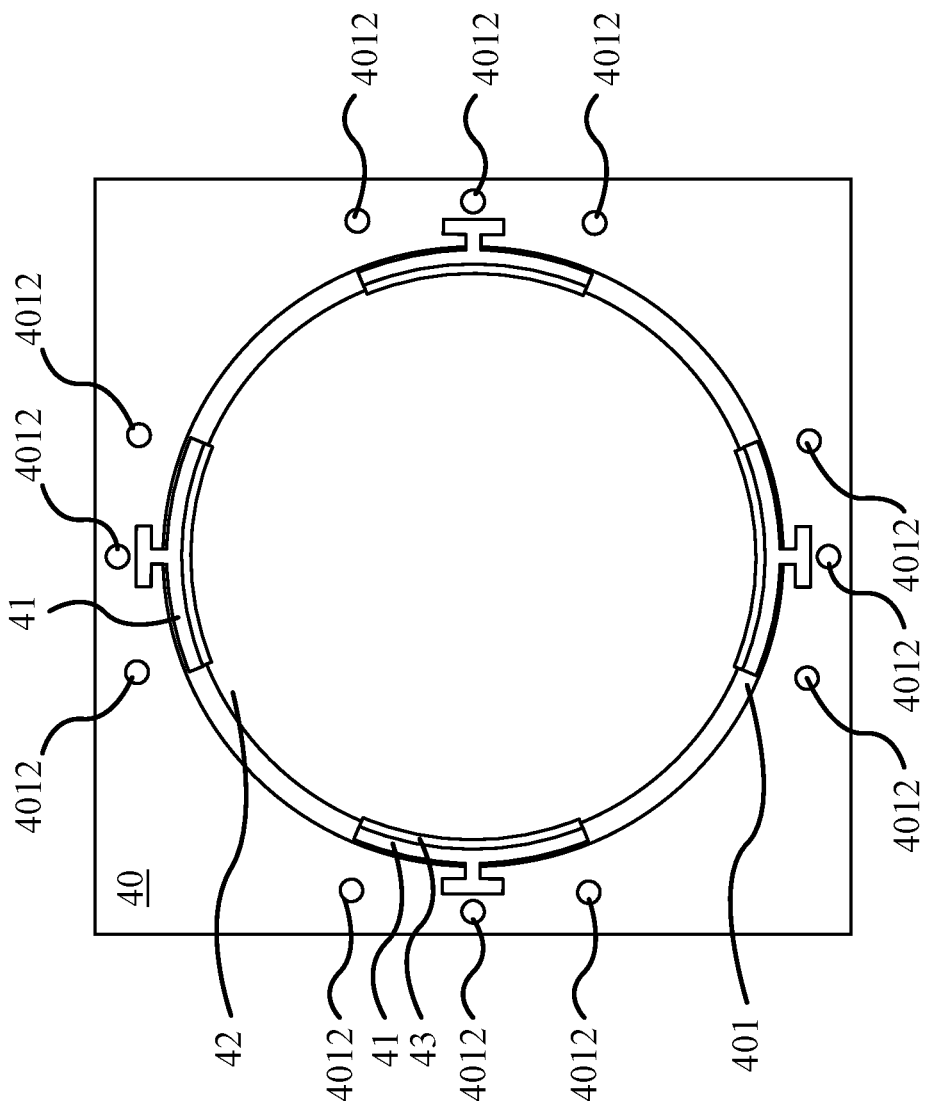
FIG. 7 is a top view of a wafer holder according to some embodiment of the present disclosure.

FIG. 7 is a top view of a wafer holder 4 according to some embodiment of the present disclosure. In this embodiment, every guiding base of the blocking devices 41 has a plurality of fastening structure, and the guiding structure 401 of the carrier plate 40 has a plurality of fastening structures 4012 in every position. Therefore, the wafer holder 4 can provide a better protection with side elastic layers 43 and a bottom elastic layer 42 while every blocking device 41 is fastened by multiple fasteners.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A wafer holder, comprising:
 a carrier plate comprising:
  a base having a carrier surface; and
  a guiding structure surrounding the base; and
 a plurality of blocking devices coupled to the carrier plate through the guiding structure,
 wherein the blocking devices are configured to move along the guiding structure, and each of the blocking devices has a curved wall, and the curved walls at least partially surrounds an area above the carrier surface.

2. The wafer holder of claim 1, wherein the carrier surface is rounded, and the guiding structure encircles the carrier surface.

3. The wafer holder of claim 1, further comprising a bottom elastic layer, wherein the bottom elastic layer is disposed on the carrier surface.

4. The wafer holder of claim 1, further comprising a plurality of side elastic layers, wherein each of the side elastic layer is disposed on a surface of one of the curved walls, and the surface is facing towards the carrier surface.

5. The wafer holder of claim 1, wherein each of the blocking devices comprises a knob, and the knob and the side elastic layer are disposed on the opposite sides of the curved wall.

6. The wafer holder of claim 1, further comprising:
a bottom elastic layer disposed on the carrier surface; and
a plurality of side elastic layers disposed on the curved walls,
wherein the bottom elastic layer touches the side elastic layers.

7. The wafer holder of claim 1, wherein the guiding structure comprises an accommodation space, and the accommodation space is located in the carrier plate, and the blocking device comprises a guiding base, and the curved wall is connected to the guiding base, and the guiding base is installed in the accommodation space.

8. The wafer holder of claim 7, wherein the guiding structure has a plurality of first fastening structures located on the top of the accommodation space, and each of the guiding bases has a second fastening structure, and each of the first fastening structures is configured to fasten one of the second fastening structures.

9. The wafer holder of claim 8, further comprising a plurality of fasteners, wherein the first fastening structures are openings, and the second fastening structures are openings, and the fasteners are configured to insert into the first and second fastening structures.

10. The wafer holder of claim 7, wherein at least two of the blocking devices have a semicircle opening, and each of the semicircle openings is located on an edge of the guiding base.

11. The wafer holder of claim 7, wherein the curved walls are disposed on the guiding bases perpendicularly.

12. The wafer holder of claim 7, wherein the guiding bases are fan-shaped.

13. The wafer holder of claim 1, wherein the curved walls are configured to cover half of the periphery of the carrier surface.

14. The wafer holder of claim 1, wherein the curved walls are configured to maintain a wafer on the carrier surface.

15. The wafer holder of claim 1, further comprising:
a plurality of first indicators disposed on the blocking devices; and
a plurality of second indicators disposed on the carrier plate,
wherein the first indicators are configured to align with the second indicators.

16. An operating method of a wafer holder, comprising:
moving a plurality of blocking devices to first positions;
disposing at least one wafer on a carrier surface of a base; and
moving the blocking devices to second positions,
wherein the wafer holder comprises a carrier plate and the blocking devices, and the carrier plate comprises the base and a guiding structure, and the guiding structure surrounds the carrier surface, and the blocking devices are coupled to the carrier plate through the guiding structure, and the blocking devices are configured to move along the guiding structure, and each of the blocking devices has a curved wall at least partially surrounding the carrier surface, and the blocking devices are brought together while being on the first positions, and the blocking devices are separate from each other's while being on the second positions.

17. The operating method of claim 16, wherein the curved walls cover half of the periphery of the carrier surface while locating on the first positions.

18. The operating method of claim 16, wherein the curved walls cover top, bottom, right, and left sides of the carrier surface while locating on the second positions.

19. The operating method of claim 16, wherein the step of disposing the wafer on the carrier surface of the base comprises:
disposing the wafer on a bottom elastic layer on the carrier surface; and
moving the wafer until the wafer touches side elastic layers on the curved walls.

20. The operating method of claim 16, wherein the blocking devices maintain the wafer on the carrier surface while the blocking devices are located on the second positions.

* * * * *